(12) United States Patent
Fong et al.

(10) Patent No.: US 9,755,603 B2
(45) Date of Patent: Sep. 5, 2017

(54) ACTIVE COMPENSATION FOR POWER AMPLIFIER GAIN DROOP

(71) Applicant: MediaTek Inc., Hsin-Chu (TW)

(72) Inventors: Keng Leong Fong, Sunnyvale, CA (US); YuenHui Chee, Redwood City, CA (US)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/053,158

(22) Filed: Feb. 25, 2016

(65) Prior Publication Data

US 2017/0012590 A1 Jan. 12, 2017

Related U.S. Application Data

(60) Provisional application No. 62/189,225, filed on Jul. 7, 2015.

(51) Int. Cl.
*H04B 1/04* (2006.01)
*H03G 3/30* (2006.01)
*H03F 3/19* (2006.01)
*H04B 17/13* (2015.01)
*H03F 3/24* (2006.01)

(52) U.S. Cl.
CPC ............ *H03G 3/3042* (2013.01); *H03F 3/19* (2013.01); *H03F 3/245* (2013.01); *H04B 1/0475* (2013.01); *H04B 17/13* (2015.01); *H03F 2200/411* (2013.01); *H03F 2200/451* (2013.01); *H04B 2001/0416* (2013.01)

(58) Field of Classification Search
CPC ............ H04B 17/13; H04B 2001/0416; H04B 1/0475; H03F 2200/451; H03F 3/19; H03F 3/21; H03G 3/3042
See application file for complete search history.

(56) References Cited

U.S. PATENT DOCUMENTS

| 5,247,542 A * | 9/1993 | Onodera | H03F 1/3247 330/254 |
| 7,783,269 B2 * | 8/2010 | Vinayak | H03F 1/0222 330/136 |
| 2004/0017291 A1 * | 1/2004 | Hardman | B60C 23/0433 340/505 |
| 2007/0085623 A1 * | 4/2007 | Staszewski | H03L 7/085 331/182 |
| 2013/0169357 A1 * | 7/2013 | Drogi | H03F 1/0227 330/127 |
| 2013/0249636 A1 * | 9/2013 | Signoff | H03F 1/30 330/289 |
| 2014/0341318 A1 * | 11/2014 | Pourkhaatoun | H04B 1/0475 375/297 |
| 2016/0373071 A1 * | 12/2016 | Retz | H03F 1/30 |

* cited by examiner

*Primary Examiner* — Dac Ha
(74) *Attorney, Agent, or Firm* — Wolf, Greenfield & Sacks, P.C.

(57) ABSTRACT

Some embodiments relate to a method and circuit for gain compensation. The method includes detecting a strength of an output signal generated by a power amplifier of a transmitter in response to a commanded transmission signal. The method also includes comparing the detected strength of the output signal to a delayed version of a detected strength of the commanded transmission signal to obtain an error signal. The method further includes compensating for gain drop of the output signal by adjusting a gain of the transmitter based on the error signal.

14 Claims, 8 Drawing Sheets

ACTIVE COMPENSATION FOR POWER AMPLIFIER GAIN DROOP

RELATED APPLICATIONS

This application claims priority to U.S. Provisional Application Ser. No. 62/189,225, titled "ACTIVE THERMAL COMPENSATION FOR PA GAIN DROOP" filed on Jul. 7, 2015, which is hereby incorporated by reference in its entirety.

BACKGROUND

Technical Field

The present application relates to compensation of gain droop in power amplifiers, and in particular to compensation of gain droop in real time.

Related Art

Radio transmitters often include a power amplifier to boost the strength of transmitted signals. The transmitted signals may be encoded with one or more packets of data.

SUMMARY

Some embodiments relate to a method for gain compensation. The method includes detecting a strength of an output signal generated by a power amplifier of a transmitter in response to a commanded transmission signal. The method also includes comparing the detected strength of the output signal to a detected strength of the commanded transmission signal to obtain an error signal. The method further includes compensating for gain drop of the output signal by adjusting a gain of the transmitter based on the error signal.

Some embodiments relate to a circuit for gain compensation. The circuit includes circuitry configured to detect a strength of an output signal generated by a power amplifier of a transmitter in response to a commanded transmission signal. The circuitry is also configured to compare the detected strength of the output signal to a detected strength of the commanded transmission signal to obtain an error signal. The circuitry is further configured to compensate for gain drop of the output signal by adjusting a gain of the transmitter based on the error signal.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

The inventors have recognized and appreciated that the gain of a power amplifier can drop, or "droop," as the temperature of the power amplifier increases. The drop in gain can occur on a short enough time scale that differences in gain are exhibited over the course of transmission of a single data packet, and can result in increased transmission errors toward the end of the packet.

One option to address gain drop is to use a temperature sensor to sense the temperature in the vicinity of a power amplifier. However, due to the slow propagation of heat from the power amplifier to the temperature sensor, the measurement may be delayed in time. Consequently, temperature sensing may not be fast enough to compensate for gain drop within the duration of a single packet of data.

Another option to address gain drop is to use pre-distorted input signals to compensate for a pre-determined gain drop over time, as the power amplifier heats up. However, such a technique may be sensitive to process variations and may not adequately compensate for gain drop over packets of different lengths.

According to some embodiments of the techniques and devices described herein, gain drop may be measured by comparing the commanded strength of the signal to be transmitted to the output signal strength of the power amplifier that amplifies the signal for transmission. Gain drop may be compensated by adjusting a gain of the transmit signal chain based upon the measured gain drop. Such a technique allows measurement of gain drop at a speed fast enough to enable gain drop compensation during the transmission of a single packet.

According to aspects of the present application, the gain drop compensation described herein may be responsive to any of a variety of causes of gain drop, such as thermal variations, process variations and/or variations in the length of the packets to be transmitted.

Figure 1A:
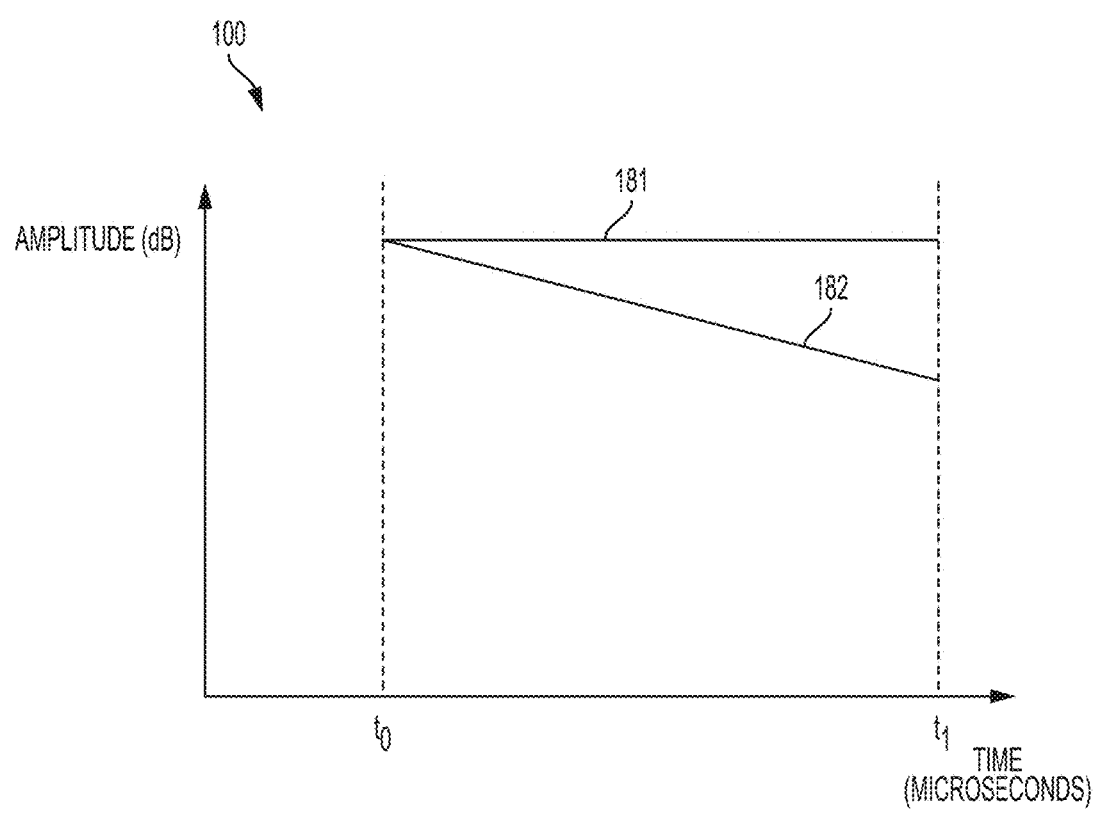
FIG. 1A shows a plot illustrating a signal output power subjected to thermal variations, according to aspects of the present application.

FIG. 1A illustrates a decrease in gain of a power amplifier over time, during the transmission of a packet. FIG. 1A shows a plot 100 of the output amplitude produced by a power amplifier over time. The horizontal axis represents time expressed in microseconds. The vertical axis represents the output amplitude of the power amplifier expressed in decibels. The amplitude may be a voltage, a current or power, for example. In some non-limiting embodiments, the amplitude plotted in FIG. 1A is an average amplitude, such as a root mean square (RMS), a arithmetic mean, a geometric mean, a median value, or any other suitable time average.

In FIG. 1A, the transmission of a packet of data is initiated at time $t_0$ and ends at time $t_1$. Line 181 represents a scenario in which the amplitude of the signal being transmitted is constant throughout the duration of the packet transmission. On the other hand, line 182 represents a real-world case in which the amplitude decays over time. The amplitude decay may arise in response to temperature variations occurring within the circuit that generates and transmits the data. For example, the gain of a power amplifier may drop as the local temperature increases due to the heat generated from the power amplifier during operation. The amplitude may decay at any rate, such as linearly or exponentially, for example.

In some cases, if not compensated, the decay rate may be between approximately 0.001 dB/20 μs and 10 dB/20 μs, between approximately 0.01 dB/20 μs and 1 dB/20 μs, or between any other suitable values or range of values.

Figure 1B:
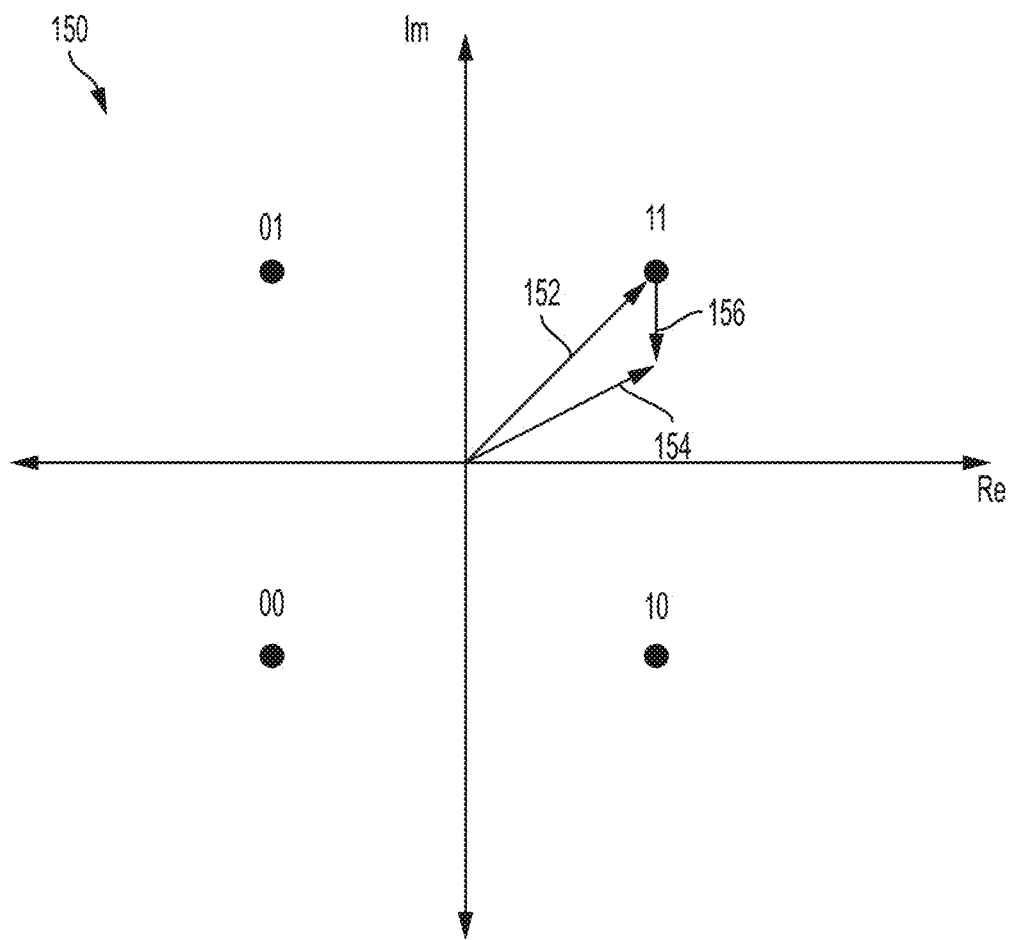
FIG. 1B illustrates the error vector associated with a signal subjected to thermal variation, according to aspects of the present application.

Due to the amplitude decay shown in FIG. 1A, the integrity of the data being transmitted may degrade over time. Accordingly, the head of a packet may be transmitted with an amplitude greater than the tail, and therefore a distortion may occur near the tail. Consequently, decision errors may arise on the receiver side. FIG. 1B illustrates a constellation diagram 150 representing signals modulated according to a digital modulation technique. Diagram 150 shows digital symbols lying on a complex plane, where the horizontal axis represents the real part, or in-phase component, and the vertical axis represents the imaginary part, or quadrature component, of a sampled signal. In the non-limiting example, the sampled signal may assume four different symbols: "00", "01", "10" and "11". The first bit of the symbol may be encoded in the real part of the transmitted signal whereas the second bit may be encoded in the imaginary part. The constellation presented in FIG. 1B represents symbols associated with a 4-quadrature amplitude modulation (4-QAM) technique or quadrature phase shift keying (QPSK) technique. While symbols comprising a pair of bits are presented in the example, the techniques described herein are not limited in this respect. For example, symbols may comprise any suitable number of bits greater than one.

Assuming a "11" symbol is transmitted at a certain time, vector 152 represents the signal that would be transmitted if no error is introduced. Vector 154 may represent the actual signal transmitted. According to aspects of the present application, vector 154 may differ from vector 152 in phase and amplitude owing to gain drop occurring within the circuit that generates and transmits the data. Error vector 156, defined as the difference between vector 152 and vector 154, represents such a deviation.

Figure 2A:
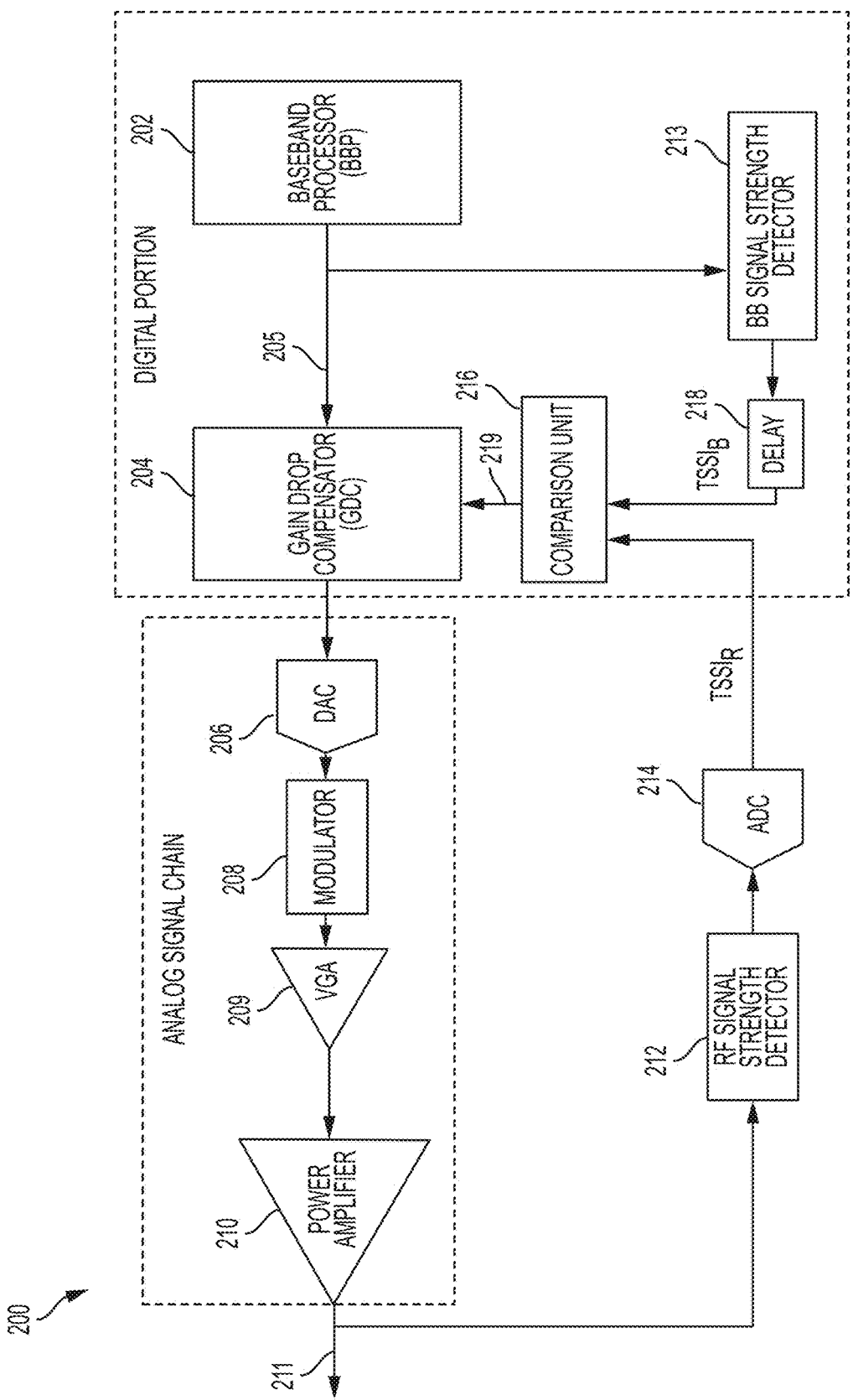
FIG. 2A illustrates a block diagram of a circuit for gain compensation where the compensation is performed in the digital domain, according to a non-limiting embodiment of the present application.

As described, aspects of the present application relate to circuits and techniques for gain drop compensation. In some non-limiting embodiments, gain drop may arise in power amplifiers as a consequence of a temperature increase. FIG. 2A illustrates a block diagram of a transmitter 200 that performs gain drop compensation at least partially in the digital domain, according to a non-limiting embodiment of the present application. Transmitter 200 may comprise a baseband processor (BBP) 202 configured to generate one or more commanded transmission signals 205. The commanded transmission signal(s) 205 may comprise one or more streams of data in digital form. The commanded transmission signal(s) 205 may be transmitted as continuous streams of data or in packets. Transmitted packets may have any suitable length. For example, packets having lengths between approximately $2^3$ bits and $2^{30}$ bits may be transmitted. However, any other suitable packet length may be used.

BBP 202 may be implemented by a processor and/or memory of the Digital Portion of transmitter 200. The processor may execute software and/or firmware stored in the memory. The various streams of data generated by BBP 202 may be combined into a single transmitted signal through any of a variety of modulation schemes, as will be discussed further below. The one or more data streams may be encoded with various types of digital information, such as video, audio, text, or any combination thereof.

In the non-limiting embodiment of FIG. 2A, the one or more streams of data generated by BBP 202 may be provided to a gain drop compensator (GDC) 204. According to aspects of the present application, GDC 204 may be configured to compensate for gain drops occurring in power amplifier 210. However, GDC 204 may compensate for a gain drop occurring anywhere within transmitter 200.

GDC 204 may be implemented by a processor of the Digital Portion of transmitter 200, which may be the same processor or a different processor than that which implements BBP 202. Alternatively, GDC 204 may be implemented by a digital circuit. The output of GDC 204 may be provided to the input of a digital-to-analog converter (DAC) 206.

DAC 206 may be implemented in any suitable fashion. For example DAC 206 may be a binary-code or thermometer-code weighted current source circuit, a binary weighted resistor circuit, a R-2R ladder circuit or a successive approximation circuit, by way of example and not limitation. In some embodiments, DAC 206 may include one digital-to-analog converter or a plurality of digital-to-analog converters, and in some embodiments may include a digital-to-analog converter for each separate data stream generated by BBP 202 and/or GDC 204. DAC 206 may output one or more analog signals.

The analog signal(s) produced by DAC 206 may be provided to the input of modulator 208. In some embodiments, modulator 208 may combine the one or more analog signals provided by DAC 206 into a pass-band signal (e.g., by modulation). Any suitable modulation scheme may be used to combine the one or more analog signals, including amplitude-based, phase-based, frequency-based modulation techniques and any combination thereof. For example, modulator 208 may perform amplitude shift keying (ASK), quadrature amplitude modulation (QAM), binary phase shift keying (BPSK), quadrature phase shift keying (QPSK), frequency shift keying (FSK), differential phase shift keying (DPSK) or any other suitable first or higher order modulation technique. The analog signal(s) may be modulated by a local oscillator that generates a signal at a carrier frequency $f_c$. Carrier frequency $f_c$ may be between any suitable value or range of values. For example, carrier frequency $f_c$ may be between approximately 1 MHz and 50 GHz, between approximately 50 MHz and 10 GHz, or between approximately 800 MHz and 5 GHz. In some embodiments, the strength of the signal outputted by modulator 208 may be temperature-dependent.

The strength of the obtained passband signal may be amplified by an optional variable gain amplifier (VGA) 209 and a power amplifier 210. Power amplifier 210 may be any suitable power amplifier circuit. For example, power amplifier 210 may be a radio frequency (RF) amplifier. Power amplifier 210 may have any suitable topology such as class A, class B, class AB, class C, class D or class E topology. Power amplifier 210 may include solid state devices such as field effect transistors (FETs), bipolar junction transistors (BJTs) or any suitable type of transistors. The gain provided by power amplifier 210 may be between approximately 0 dB and 60 dB, between approximately 10 dB and 50 dB, or between approximately 20 dB and 40 dB, by way of example and not limitation.

According to aspects of the present application, the gain provided by power amplifier 210 may be subject to variations due to variations in temperature. The temperature may increase in response to heat generated by currents flowing within power amplifier 210 itself or of other circuit elements. In some embodiments, the temperature at which power amplifier 210 operates may increase over time once transmission begins. Consequently, signals transmitted at the beginning of a transmission packet may exhibit larger signal strengths compared to signals transmitted subsequently in the packet.

The output signal 211 produced by power amplifier 210 may be transmitted through a communication channel that may include a cable and/or an antenna. In some embodiments, the communication channel may include a wireless radio frequency link, such as a cellular link, a Wi-Fi link, a Bluetooth link or any other suitable type of radio frequency link.

The strength of output signal 211 may be detected by an RF signal strength detector 212. In some embodiments, RF signal strength detector 212 may detect the average power, the root mean square power or the envelope of the output signal. By way of example and not limitation, RF signal strength detector 212 may be a rectifier or an envelope demodulator, in some embodiments. The strength of the signal detected by RF signal strength detector 212 may be converted into the digital domain by analog-to-digital converter (ADC) 214. ADC 214 may be any type of analog-to-digital converter circuit, such as a flash ADC, a ramp-compare ADC, a successive approximation ADC, a delta-encoded ADC, a sigma-delta ADC or an integrating ADC, by way of example and not limitation. The output of ADC 214 may be a digital representation of the strength of the output signal outputted by power amplifier 210 and may be inputted to comparison unit 216. The output of ADC 214 is termed $TSSI_R$.

As with RF signal strength detector 212, a baseband signal strength detector 213 may detect the signal strength of the commanded signal 205 produced by the BBP 202. Baseband signal strength detector 213 may be implemented by a processor or a digital circuit. The output of baseband signal strength detector 213 is termed $TSSI_B$. In some embodiments, the one or more data streams outputted by BBP 202 may be delayed in time through delay unit 218. By way of example and not limitation, delay unit 218 may be a digital delay implemented by a processor or digital circuit. The amount of delay introduced may be equal or proportional to the delay exhibited by a data stream or a packet propagating through elements 204, 206, 208, 209, 210, 212 and 214, to temporally align $TSSI_B$ with $TSSI_R$. The amount of delay introduced may be fixed or programmable.

Comparison unit 216 may compare $TSSI_B$ with $TSSI_R$ to produce an error signal 219. In some embodiments, comparison unit 216 may subtract the two signals to produce the error signal 219. Comparison unit 216 may be implemented by a processor, or digital circuit, such as a comparator. The error signal 219 outputted by comparison unit 216 may represent the amount of signal strength lost due to a gain drop occurring in power amplifier 210 or elsewhere in the analog signal chain. Error signal 219 may be used to readjust the signal provided to DAC 206 by GDC 204.

In response to error signal 219, GDC 204 may operate so as to compensate the strength of the output signal by increasing the strength of the commanded signal 205 produced by the BBP 202 by the inverse of the error signal 219. Accordingly, the strength of the signal provided to power amplifier 210 may increase over time, thus compensating for gain drop as temperature increases. For example, if the gain provided by power amplifier drops by 0.1 dB/20 μs, the strength of the signal provided to power amplifier 210 may be increased by 0.1 dB/20 μs. To do so, the GDC 204 may increase the commanded signal produced by the BBP 202 by an amount equal to 0.1 dB/20 μs.

According to aspects of the present application, the gain drop compensation may be performed in real time, within the duration of the transmission of a single packet. With the compensation, the whole packet is transmitted with a constant signal strength over time, thus reducing or minimizing the probability of decision errors on the receiver side.

While in the non-limiting example described herein, GDC 204 is configured to compensate for a gain drop arising within power amplifier 210, not all embodiments are limited in this respect, as gain drops may arise within any element of transmitter 200, particularly in the analog signal chain, and GDC 204 can compensate for this gain drop regardless of which element in the analog signal chain exhibits gain drop.

Figure 2B:
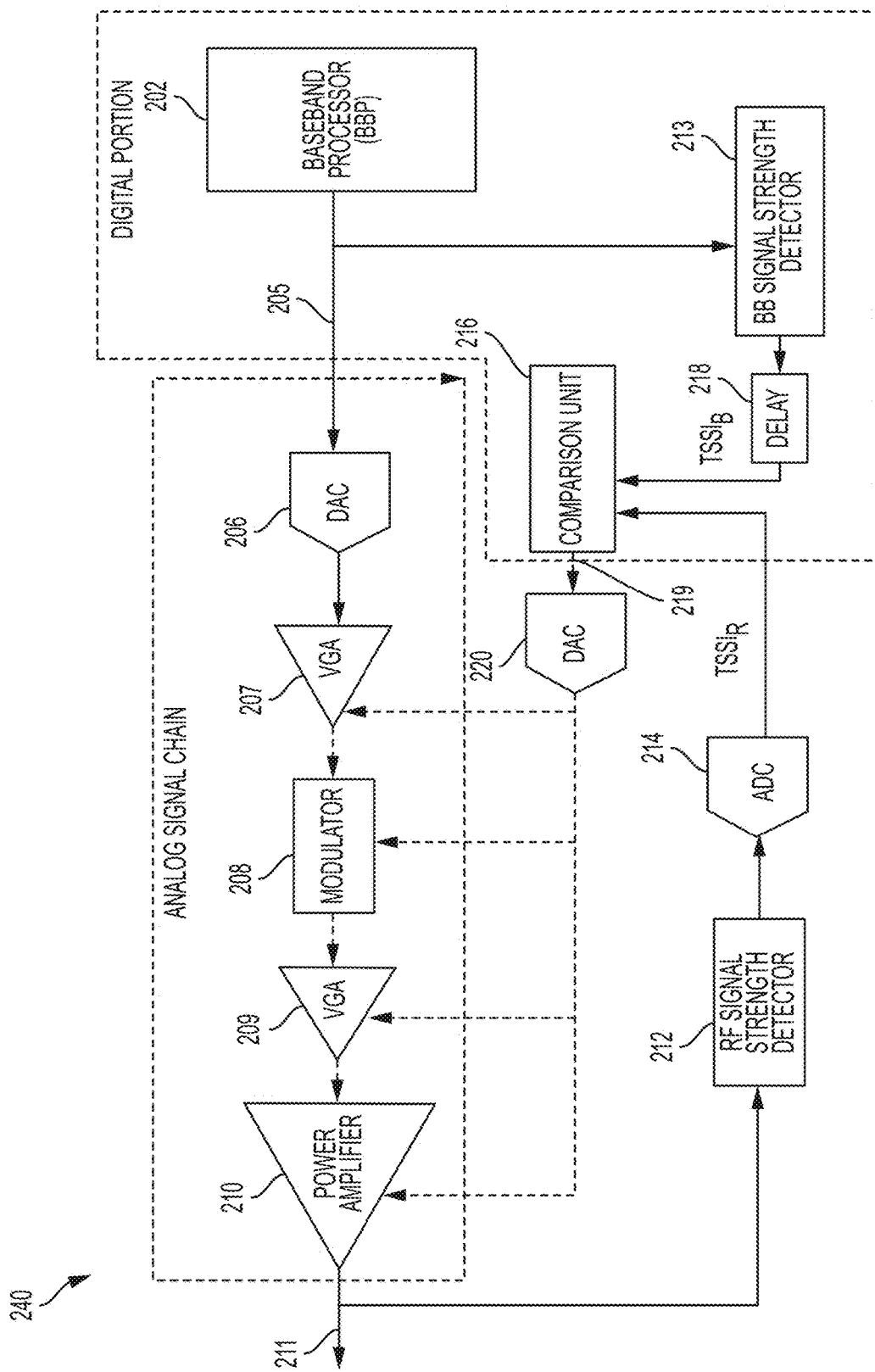
FIG. 2B illustrates a block diagram of a circuit for gain compensation where the compensation is performed in the analog domain, according to a non-limiting embodiment of the present application.

FIG. 2B illustrates a block diagram of a circuit for gain compensation where the compensation is performed in the analog domain, according to a non-limiting embodiment of the present application. Transmitter 240 may operate in a similar fashion to transmitter 200. Similarly to transmitter 200, transmitter 240 may comprise BBP 202, DAC 206, modulator 208, VGA 209, power amplifier 210, RF signal strength detector 212, ADC 214, comparison unit 216 and delay unit 218. Additionally, transmitter 240 may comprise DAC 220 and variable gain amplifiers (VGA) 207. VGAs may be placed anywhere along the analog signal path between BBP 202 and power amplifier 210. VGA 207 and 209 may be any suitable type of amplifier.

Similarly to transmitter 200, comparison unit 216 may compare a delayed version of the one or more data streams generated by BBP 202 with a digital representation of the strength of the signal outputted by power amplifier 210. However, in transmitter 240, error signal 219 may be converted into the analog domain through DAC 220 and fed into VGA 207, VGA 209, and/or modulator 208 to increase the strength of the signal provided to the power amplifier 210. In some embodiments, the analog error signal may be provided directly to power amplifier 210, which may modify its gain based on the error signal. In some embodiments, the analog error signal may be provided to modulator 208, which may increase its gain.

Figure 2C:
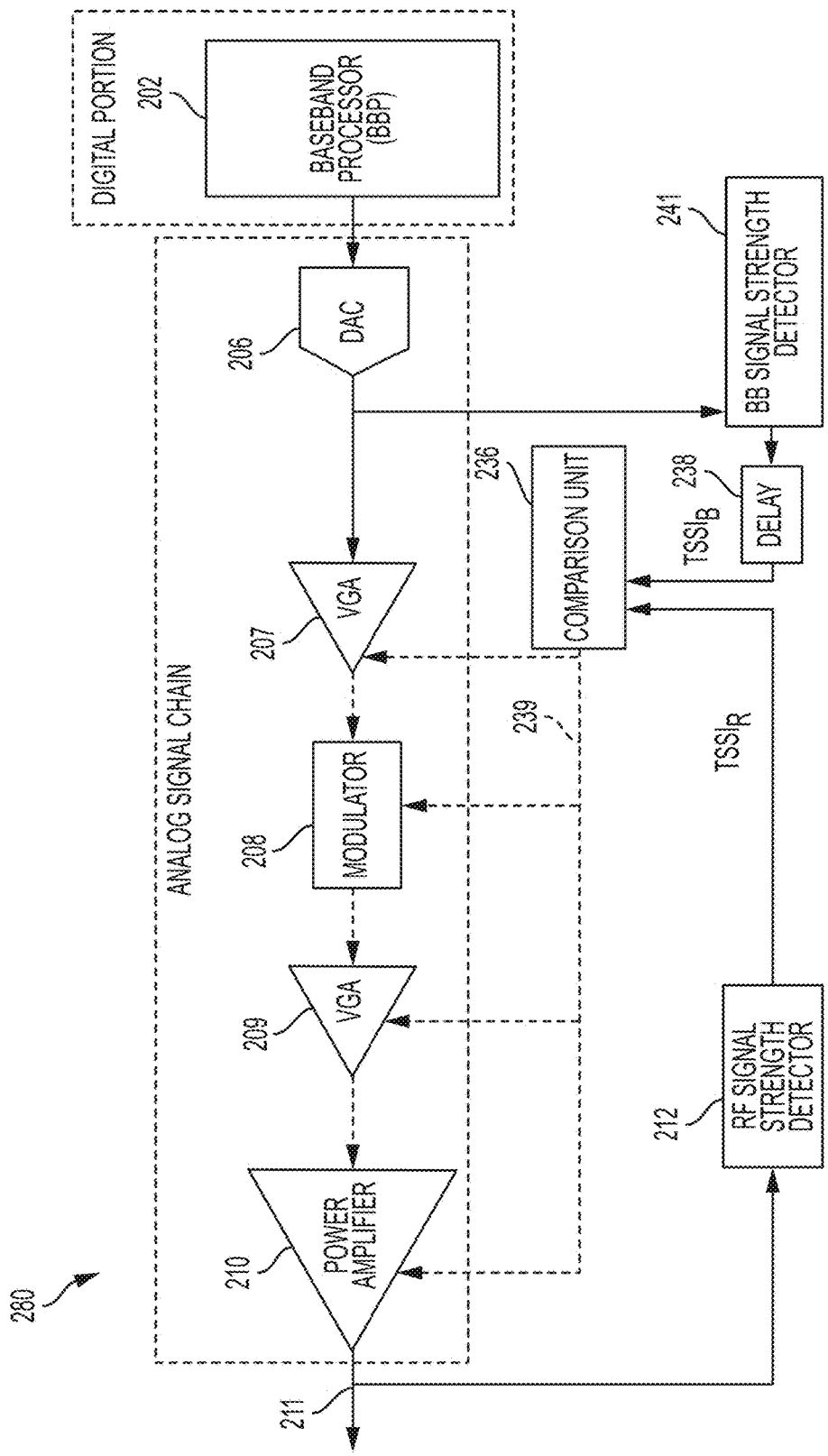
FIG. 2C illustrates a block diagram of a circuit for gain compensation where the compensation and the comparison are performed in the analog domain, according to a non-limiting embodiment of the present application.

FIG. 2C illustrates a block diagram of a circuit for gain compensation where the compensation and the comparison are performed in the analog domain, according to a non-limiting embodiment of the present application. Transmitter 280 may operate in a similar fashion to transmitter 240. Similarly to the embodiment discussed in connection with FIG. 2B, transmitter 280 may comprise BBP 202, DAC 206, VGA 207, modulator 208, VGA 209, power amplifier 210 and RF signal strength detector 212. However, the comparison may be performed in the analog domain by a comparison unit 236. Comparison unit 236 may be a circuit, such as a comparator, for example, or any other circuit that is configured to compare the signals. An analog version of the commanded signal(s) may be delayed through analog delay circuit 238 and provided as input to comparison unit 236. In some embodiments, delay circuit 238 may comprise a delay line. Comparison unit 236 may generate error signal 239, which may be proportional to the difference of the strength of the two input signals. Error signal 239 may be used as input to VGA 207, VGA 209, power amplifier 210, modulator 208 or any suitable combination thereof.

In some embodiments, any of transmitter 200, 240 and/or 280 may be integrated on a monolithic integrated circuit. In other embodiments, some or all circuit elements may be circuits that are formed on separate chips or boards.

Figure 3:
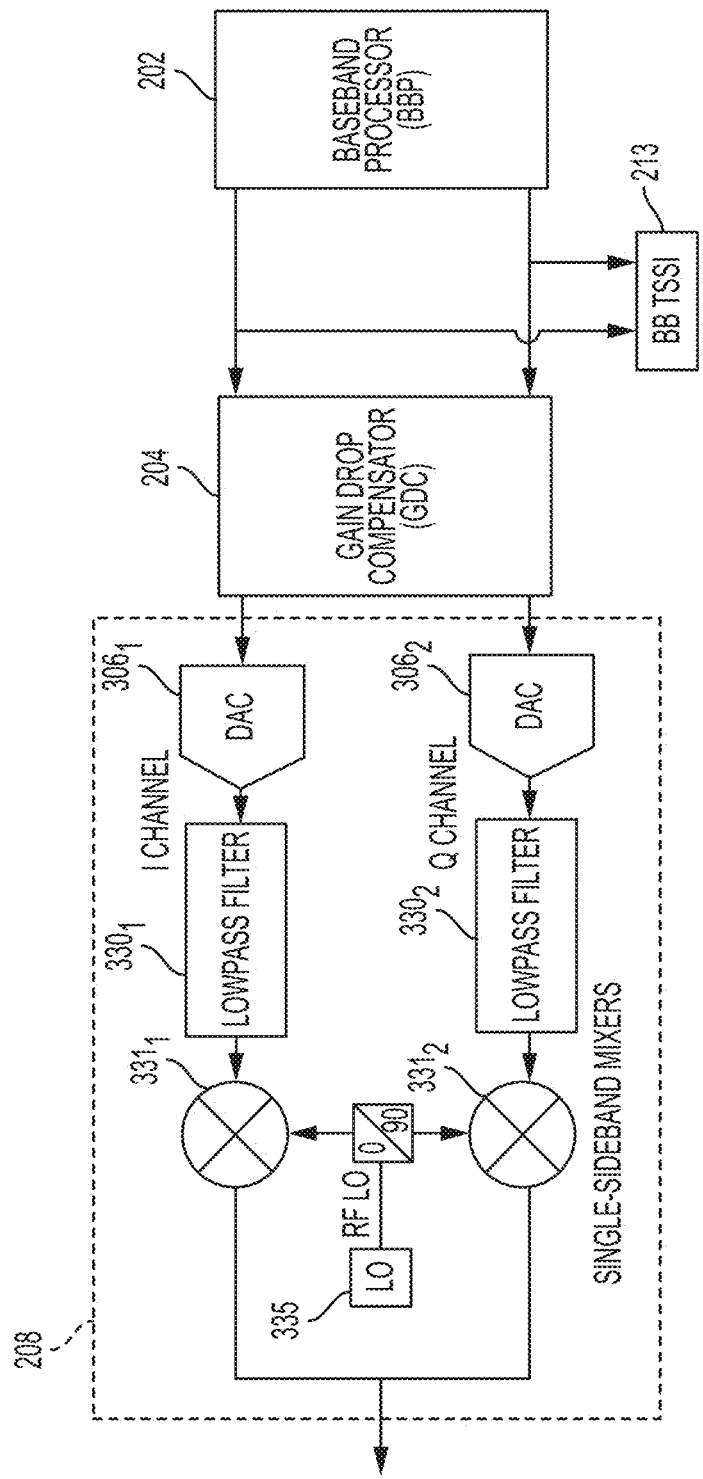
FIG. 3 illustrates a non-limiting embodiment of a modulator circuit.

In some non-limiting embodiments, modulator 208 may perform modulation using an in-phase component and a quadrature component, as illustrated in FIG. 3. In the embodiment of FIG. 3, BBP 202 may generate two streams of data, which may be compensated by GDC 204. A bank of two DACs $306_1$ and $306_2$ may convert the two received data streams into the analog domain. Subsequently, the two analog signals may be filtered through low-pass filters $330_1$ and $330_2$ so as to minimize the DAC image signals. The two filtered signals may be mixed through mixers $331_1$ and $331_2$ with an oscillating signal generated by local oscillator 335. The oscillating signal may be split and one version may be phase shifted so as to obtain two modulated signals in quadrature with each other. The two modulated signals may be added and provided to power amplifier 210.

Figure 4:
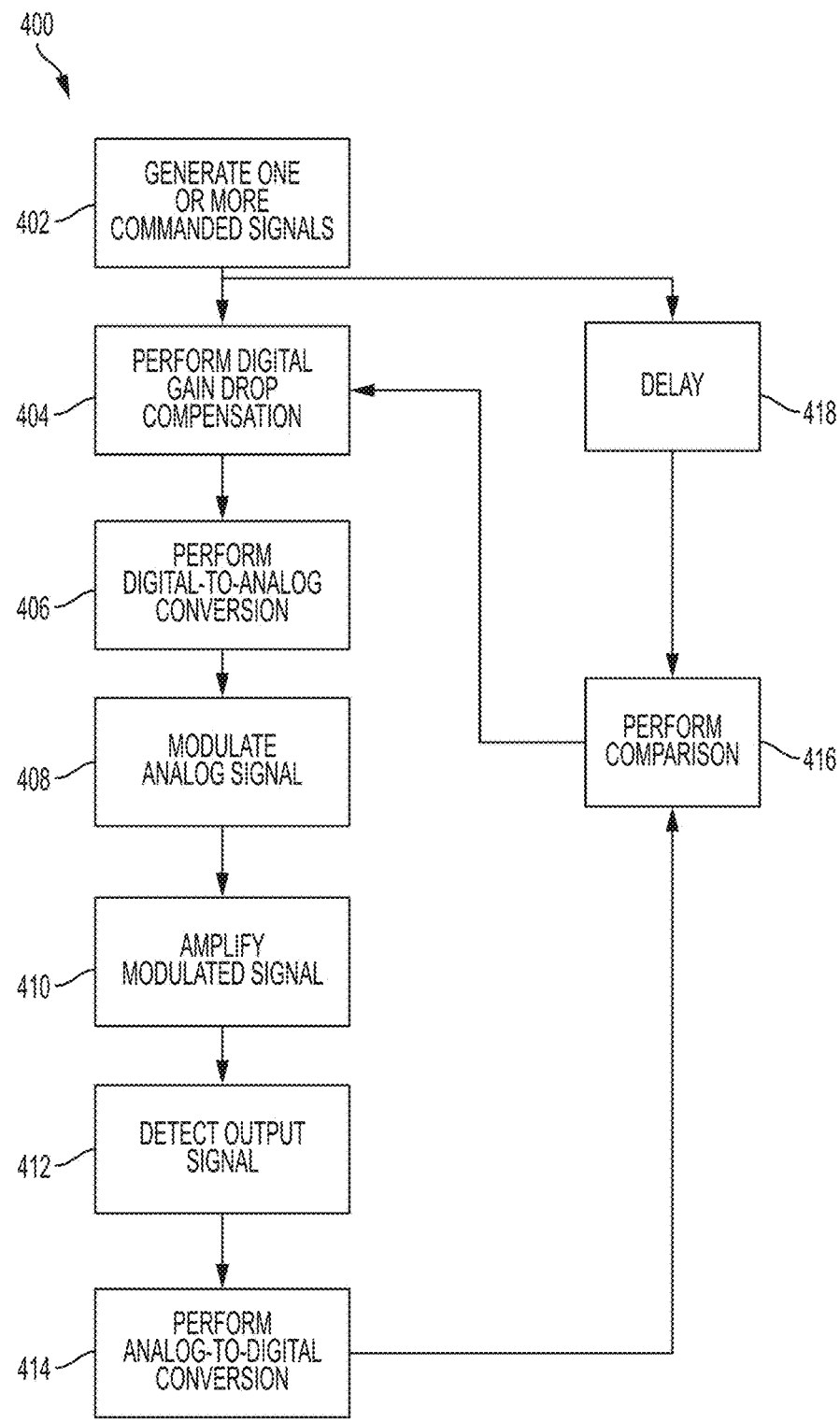
FIG. 4 illustrates the steps of a method for gain compensation in which the compensation is performed in the digital domain, according to a non-limiting embodiment of the present application.

FIG. 4 illustrates the steps of a method for gain compensation in which the compensation is performed in the digital domain, according to aspects of the present application. Method 400 may be used in connection with transmitter 200 of FIG. 2A, as an example, and therefore reference to transmitter 200 is made in describing the method. However, alternative methods for gain drop compensation may be used.

Method 400 begins at step 402, where one or more commanded signals may be generated. Each commanded signal may comprise continuous streams of data or packets of data. The one or more commanded signals may be encoded with various types of digital information, such as video, audio, text, or any combination thereof. In some non-limiting embodiments, the generation of the one or more commanded signals may occur in response to one or more control signals (not shown).

In step 404, gain drop compensation may be performed. The compensation may be performed in the digital domain, based on the input provided by an error signal. In some embodiments, gain drop compensation is performed through GDC 204 and may comprise digital multiplication, for example.

In step 406, the one or more compensated signals may be converted into the analog domain. In some embodiments, DAC 206 may be used to perform the conversion. In addition, a digital-to-analog conversion may be performed for each of the commanded signals generated.

In step 408, the analog signals may be modulated and combined.

In step 410, the strength of the modulated signal may be amplified by a power amplifier.

In step 412, the strength of the output signal of the power amplifier may be detected.

In step 414, the detected signal may be converted into the digital domain. The analog-to-digital converter may be implemented by ADC 214, in some embodiments.

In step 416, the digital signal obtained in step 414 may be compared with a reference signal. In some embodiments the reference signal may comprise the one or more commanded signals generated in step 402.

In some embodiments, the one or more signals generated in step 402 may be delayed in step 418 and the resulting delayed signal may be used as a reference signal in step 416. The amount of delay introduced may be equal or proportional to the delay exhibited by the one or more commanded signals as they undergo steps 404 through 414.

The method for gain drop compensation may recur from step 404, based on the error signal generated in step 416.

Figure 5:
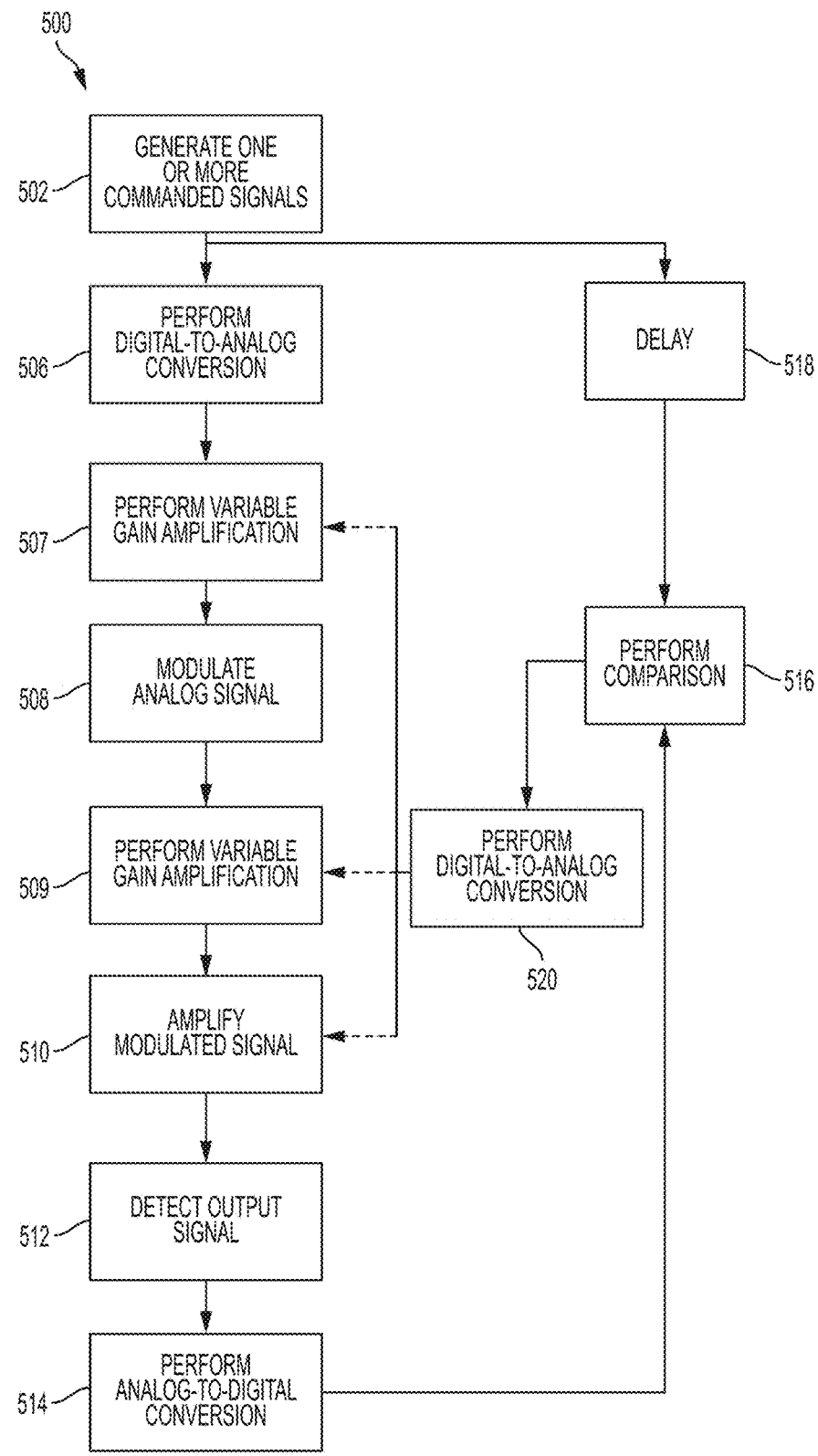
FIG. 5 illustrates the steps of a method for gain compensation in which the compensation is performed in the analog domain, according to a non-limiting embodiment of the present application.

FIG. 5 illustrates the steps of a method for gain compensation in which the compensation is performed in the analog domain, according to aspects of the present application. Method 500 may be used in connection with the transmitter 240 of FIG. 2B, as an example, and therefore reference to the transmitter 240 is made in describing the method. However, alternative methods for gain drop compensation may be used.

Method 500 begins at step 502, where one or more commanded signals may be generated, as discussed above.

In step 506, the one or more commanded signals may be converted into the analog domain. In some embodiments, DAC 206 may be used to perform the conversion. In addition, a digital-to-analog conversion may be performed for each of the commanded signals generated.

In step 507, a variable gain amplification may be performed. The amplification may be performed in the analog domain.

In step 508, the analog signals may be modulated and combined.

In step 509, a second optional variable gain amplification stage may be performed. Step 509 may occur in addition to or in lieu of step 507.

In step 510, the strength of the modulated signal may be amplified. According to aspects of the present application, the amplification may exhibit gain drop due to temperature variations. In some embodiments, as will be discussed further below, the strength of the modulated signals to be amplified may be increased over time to offset the gain drop. As a result, the strength of the output signal becomes constant owing to the gain drop compensation performed in steps 507 and/or 509.

In step 512, the strength of the output signal may be detected. In step 514, the detected signal may be converted into the digital domain. The analog-to-digital converter may be performed through ADC 214, in some embodiments.

In step 516, the digital signal obtained in step 514 may be compared with a reference signal. In some embodiments the reference signal may comprise the one or more commanded signals generated in step 502. As a result of the comparison, an error signal may be generated. In some embodiments, the error signal may represent the rate of gain drop occurring throughout successive iterations of step 510. In some embodiments, the error signal is proportional to the difference between the strength of the output signal and the strength that the output signal would exhibit if the gain were constant over time. In some embodiments, the error signal is computed as the difference between the delayed commanded signal(s) and the signal obtained in step 514.

In some embodiments, the one or more signals generated in step 502 may be delayed and the resulting delayed signal may be used as a reference signal in step 516, according to step 518. The amount of delay introduced may be equal or proportional to the delay exhibited by the one or more commanded signals as they undergo steps 504 through 514.

In step 520, the error signal may be converted into the analog domain.

The method for gain drop compensation may recur from step 507 and/or 509, based on the error signal generated in step 516. In some embodiments, the analog signals may be multiplied by a gain factor proportional to the error signal.

In some embodiments, the amplification of step 510 may also be proportional to the error signal generated in step 516.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:

1. A method for gain compensation comprising:
   (A) detecting a strength of an output signal generated by a power amplifier of a transmitter in response to a commanded transmission signal;
   (B) comparing the detected strength of the output signal to a detected strength of the commanded transmission signal to obtain an error signal;
   (C) compensating for gain drop of the output signal by adjusting a gain of the transmitter based on the error signal,
   wherein (A), (B) and (C) are performed during a transmission of a single packet.

2. The method for gain compensation of claim 1, wherein the duration of the transmission of the packet is between 10 microseconds and 100 milliseconds.

3. The method for gain compensation of claim 1, further comprising:
   (D) delaying the detected strength of the commanded transmission signal prior to (B).

4. The method of claim 3, wherein the detected strength of the commanded transmission signal is delayed in (D) to temporally align the detected strength of the commanded transmission signal with the detected strength of the output signal.

5. The method for gain compensation of claim 1, wherein (C) is performed by a digital circuit.

6. The method for gain compensation of claim 1, wherein (C) is performed by an analog circuit.

7. The method of claim 1, wherein compensating for gain drop of the output signal is performed to render the strength of the output signal constant.

8. A circuit for gain compensation comprising:
   circuitry configured to:
   (A) detect a strength of an output signal generated by a power amplifier of a transmitter in response to a commanded transmission signal;
   (B) compare the detected strength of the output signal to a detected strength of the commanded transmission signal to obtain an error signal;
   (C) compensate for gain drop of the output signal by adjusting a gain of the transmitter based on the error signal,
   wherein (A), (B) and (C) are performed during a transmission of a single packet.

9. The circuit for gain compensation of claim 8, wherein the circuitry is further configured to:
   (D) delay the detected strength of the commanded transmission signal prior to (B).

10. The circuit for gain compensation of claim 9, wherein the commanded transmission signal is delayed in (D) to temporally align the detected strength of the commanded transmission signal with the detected strength of the output signal.

11. The circuit for gain compensation of claim 8, further comprising at least one analog-to-digital-converter to digitize the detected strength of the output signal prior to (B).

12. The circuit for gain compensation of claim 8, wherein the circuit for gain compensation is configured to compensate for gain drop with a digital circuit.

13. The circuit for gain compensation of claim 8, wherein the circuit for gain compensation is configured to compensate for gain drop with an analog circuit.

14. The circuit for gain compensation of claim 8, wherein the circuit is configured to compensate for gain drop of the output signal to render the strength of the output signal constant.

* * * * *